United States Patent
Lin et al.

(10) Patent No.: US 8,593,902 B2
(45) Date of Patent: Nov. 26, 2013

(54) CONTROLLER AND ACCESS METHOD FOR DDR PSRAM AND OPERATING METHOD THEREOF

(75) Inventors: Chih-Hsin Lin, Taoyuan (TW);
Tsung-Huang Chen, New Taipei (TW);
Bing-Shiun Wang, Keelung (TW);
Jen-Pin Su, Zhubei (TW)

(73) Assignee: Mediatek Inc., Hsin-Chu (TW)

( * ) Notice: Subject to any disclaimer, the term of this patent is extended or adjusted under 35 U.S.C. 154(b) by 73 days.

(21) Appl. No.: 13/311,352

(22) Filed: Dec. 5, 2011

(65) Prior Publication Data

US 2013/0058174 A1   Mar. 7, 2013

Related U.S. Application Data

(60) Provisional application No. 61/531,187, filed on Sep. 6, 2011.

(51) Int. Cl.
*G11C 8/16* (2006.01)
*G11C 7/10* (2006.01)

(52) U.S. Cl.
CPC ................................ *G11C 7/1072* (2013.01)
USPC ............... 365/233.13; 365/193; 365/189.04; 365/189.18; 365/233.11

(58) Field of Classification Search
CPC ...... G11C 11/4076; G11C 7/22; G11C 7/225; G11C 16/32
USPC .......... 365/193, 189.04, 189.18, 194, 233.11, 365/233.13
See application file for complete search history.

(56) References Cited

U.S. PATENT DOCUMENTS

2012/0195141 A1 *   8/2012   Magee et al. ................. 365/193

* cited by examiner

*Primary Examiner* — Thong Q Le
(74) *Attorney, Agent, or Firm* — McClure, Qualey & Rodack, LLP

(57) ABSTRACT

A controller for a DDR PSRAM is provided. The controller includes a single rate processing unit, a double rate processing unit and a selector. The signal rate processing unit obtains a single data rate data according to a first data and a first clock. The double rate processing unit obtains a double data rate data according to a second data and a second clock that is two times the frequency of the first clock. The selector selectively provides any of the single data rate data and the double data rate data to the DDR PSRAM via a common bus according to a control signal.

26 Claims, 7 Drawing Sheets

CONTROLLER AND ACCESS METHOD FOR DDR PSRAM AND OPERATING METHOD THEREOF

CROSS REFERENCE TO RELATED APPLICATIONS

This application claims priority of U.S. Provisional Application No. 61/531,187, filed on Sep. 6, 2011, the entirety of which is incorporated by reference herein.

BACKGROUND OF THE INVENTION

1. Field of the Invention

The invention relates to a pseudo SRAM (PSRAM), and more particularly to a controller and a memory device of a double data rate pseudo (DDR) PSRAM, and the protocol therebetween.

2. Description of the Related Art

In portable applications, such as handheld/wireless devices, the use of low power consuming memory is essential. A PSRAM device meets both low power consumption and high density requirements. A PSRAM, like a conventional dynamic random access memory (DRAM), contains dynamic memory cells but, in terms of interface and packaging, has the appearance of a static random access memory (SRAM).

A PSRAM may operate in a burst mode. The burst mode enhances the speed of storing and retrieving data. In the burst mode, specific functions must occur in a predetermined sequence. Such functions are generally performed in response to command signals provided by a controller of the PSRAM device. The timing of the command signals is determined according a clock signal and is aligned to an edge (rising or falling) of the clock signal or occurs after a predetermined time after the edge (rising or falling) of the clock signal. Furthermore, in the burst mode, the PSRAM device may operate in fixed and variable modes of wait states, wherein the wait state determines a minimal number of clock cycles that pass before a valid data is present on a data bus.

In a double data rate (DDR) SDRAM device, both the rising and falling edges of the clock signal are trigger points for read and write operations. Compared with a single data rate (SDR) SDRAM device, the DDR SDRAM device using the same clock frequency will double the data rate, and a differential clock scheme is used to conform to increased timing accuracy requirements.

BRIEF SUMMARY OF THE INVENTION

Controllers and access methods for a double data rate pseudo SRAM (DDR PSRAM) and an operating method thereof are provided. An embodiment of a controller for a double data rate pseudo SRAM (DDR PSRAM) is provided. The controller comprises a single rate processing unit, a double rate processing unit and a selector. The single rate processing unit obtains a single data rate data according to a first data and a first clock. The double rate processing unit obtains a double data rate data according to a second data and a second clock that is two times the frequency of the first clock. The selector selectively provides any of the single data rate data and the double data rate data to the DDR PSRAM via a common bus according to a control signal.

Furthermore, an embodiment of an access method for writing data to a DDR PSRAM is provided. A single data rate data is obtained according to a first data and a first clock. A double data rate data is obtained according to a second data and a second clock that is two times the frequency of the first clock. Any of the single data rate data and the double data rate data is selectively provided to the DDR PSRAM via a common bus.

Moreover, another embodiment of a controller for a DDR PSRAM is provided. The controller comprises a single rate processing unit, an output buffer, a data strobe gating unit and a data receiver. The single rate processing unit obtains a single data rate data according to a first data. The output buffer provides the single data rate data to the DDR PSRAM via a common bus in a command phase. The data strobe gating unit gates a data strobe signal from the DDR PSRAM to obtain a gated data strobe signal in a read data phase. The data receiver receives a double data rate data from the DDR PSRAM via the common bus according to the gated data strobe signal, to obtain a second data.

In addition, another embodiment of an access method for reading data from a DDR PSRAM is provided. A single data rate data is obtained according to a first data. The single data rate data is provided to the DDR PSRAM via a common bus in a command phase. A data strobe signal from the DDR PSRAM is gated to obtain a gated data strobe signal in a read data phase. A double data rate data from the DDR PSRAM is received via the common bus according to the gated data strobe signal to obtain a second data.

Furthermore, an embodiment of an operating method performed by a double data rate pseudo SRAM (DDR PSRAM) is provided. A single data rate data from a controller is received via a common bus. A data strobe signal is provided to the controller, and the data strobe signal is de-asserted after a read command from the controller is accepted. A double data rate data is transmitted to the controller via the common bus in response to the received single data rate data. The data strobe signal is toggled in response to the transmitted double data rate data. The single data rate data comprises an address of the DDR PSRAM and the double data rate data comprises data stored in the address of the DDR PSRAM. The controller is enabled to receive the double data rate data according to the data strobe signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
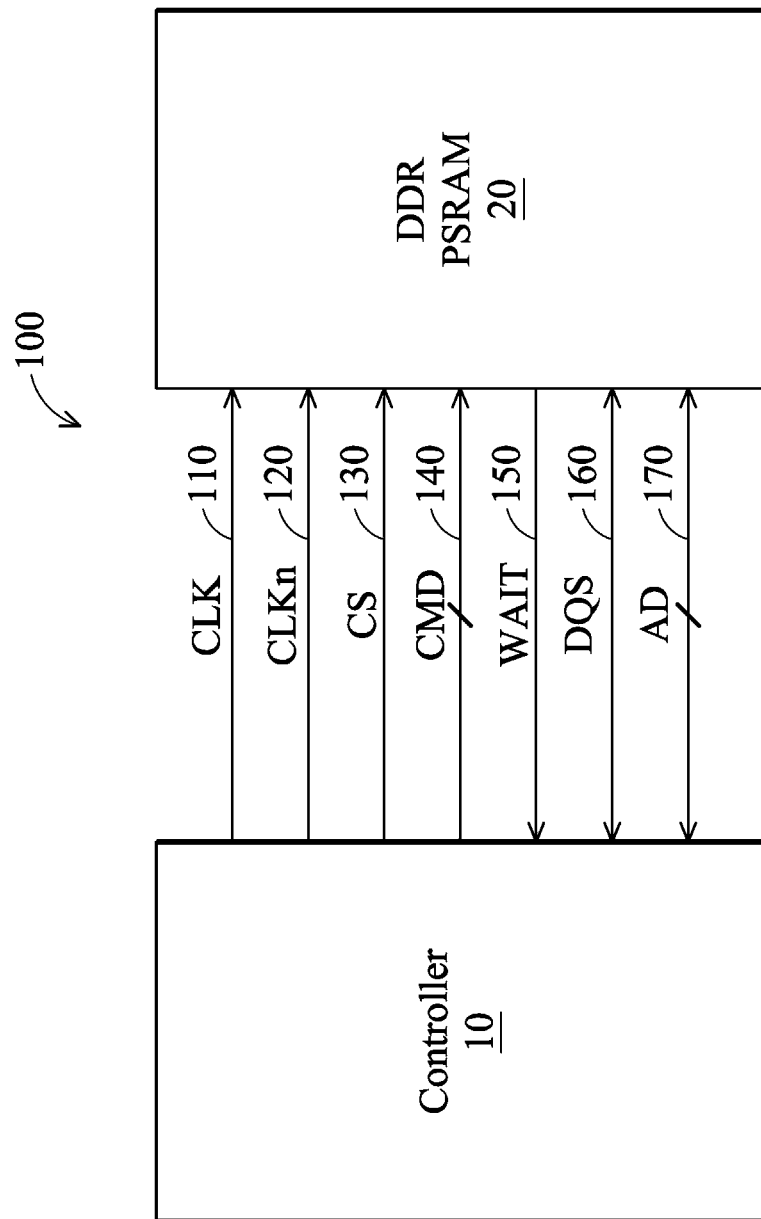
FIG. 1 shows an electronic device comprising a controller and a DDR PSRAM.

FIG. 1 shows an electronic device 100. The electronic device 100 comprises a controller 10 and a DDR PSRAM 20. Furthermore, the electronic device 100 further comprises a plurality of unidirectional transmission lines and a plurality of bi-directional transmission lines with tri-state between the controller 10 and the DDR PSRAM 20. Lines 110 and 120 are unidirectional transmission lines for providing a pair of differential clock signals CLK and CLKn from the controller 10 to the DDR PSRAM 20. Line 130 is a unidirectional line for providing a chip select signal CS from the controller 10 to the DDR PSRAM 20. The bus 140 comprises a plurality of unidirectional transmission lines for providing a command signal CMD from the controller 10 to the DDR PSRAM 20. The line 150 is a unidirectional line for providing a wait signal WAIT from the DDR PSRAM 20 to the controller 10, wherein the wait signal WAIT is used to notify the controller 10 when valid data with double data rate is present on the bus 170. Line 160 is a bi-directional transmission line for transferring a data strobe signal DQS between the controller 10 and the DDR PSRAM 20. Bus 170 is a common bus comprising a plurality of bi-directional transmission lines for transferring of an address/data signal AD, wherein the address/data signal AD comprising address and data streams with different transfer rates are multiplexed into the bus 170. Compared with a conventional DDR PSRAM device, the DDR PSRAM 20 is a low pin count (LPC) memory due to the sharing of the address streams and data streams on the bus 170.

Figure 2:
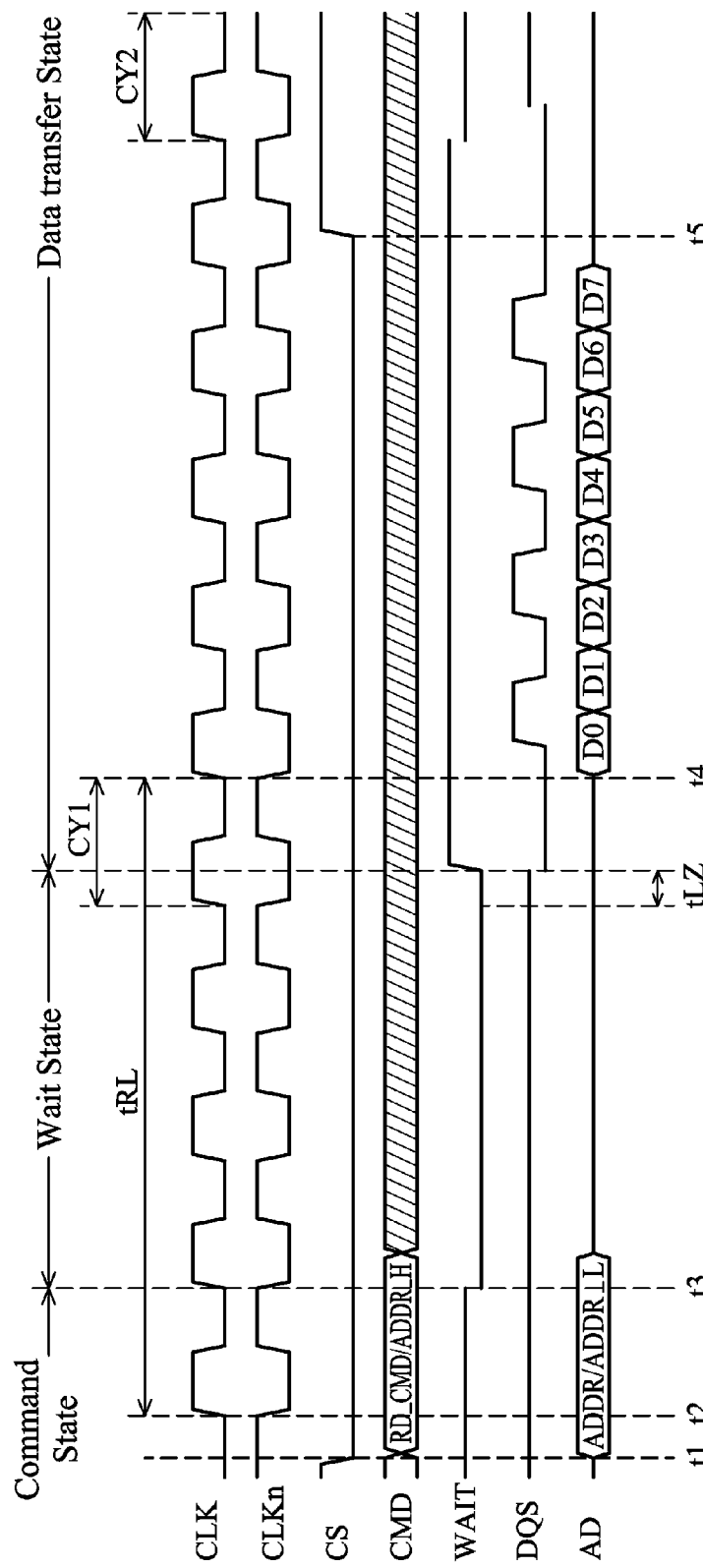
FIG. 2 shows a waveform illustrating the signals between the controller 10 and the DDR PSRAM of FIG. 1.

FIG. 2 shows a waveform illustrating the signals between the controller 10 and the DDR PSRAM of FIG. 1. Referring to FIG. 1 and FIG. 2 together, the controller 10 de-asserts the chip select signal CS to select the DDR PSRAM 20 at time t1, and then the controller 10 provides a read command RD_CMD to the DDR PSRAM 20 via the command signal CMD. At the same time, the controller 10 also provides an address ADDR to the DDR PSRAM 20 via the address/data signal AD. In one embodiment, the address ADDR may be divided into a high byte ADDR_H and a low byte ADDR_L, and the controller 10 provides the high byte ADDR_H via the command signal CMD and provides the low byte ADDR_L via the address/data signal AD. At time t2, the controller 10 provides the clock signals CLK and CLKn to the DDR PSRAM 20, so that the DDR PSRAM 20 can receive (may alternately refer to fetch) the command signal CMD and the address/data signal AD according to the clock signals CLK and CLKn in a command state. For example, in FIG. 2, the DDR PSRAM 20 receives the command signal CMD and the address/data signal AD in a rising edge of the clock signal CLK at time t2. When the read command RD_CMD is accepted by the DDR PSRAM 20 from the command signal CMD, the DDR PSRAM 20 de-asserts the wait signal WAIT at time t3, to notify the controller 10 to enter a wait state. When the read command RD_CMD and the address ADDR are accepted, the DDR PSRAM 20 executes a read operation to obtain the data from a memory cell of the DDR PSRAM 20 according to the address ADDR. Before transmitting the obtained data to the controller 10, the DDR PSRAM 20 asserts the wait signal WAIT and de-asserts the data strobe signal DQS in a clock cycle CY1, which indicates that the obtained data is ready to be transmitted to the controller 10. In FIG. 2, the DDR PSRAM 20 is operating in a variable mode of the wait state, thus the time period tRL is variable in clock cycles (read latency) according to various specifications. At time t4, the DDR PSRAM 20 starts to provide the obtained data D0-D7 to the controller 10. Furthermore, the DDR PSRAM 20 may toggle the data strobe signal DQS in response to the data D0-D7. Thus, the controller 10 may sequentially receive the data D0-D7 according to both rising and falling edges of the data strobe signal DQS. After the data D0-D7 are received, the controller 10 asserts the chip select signal CS at time t5 to finish the read operation. Then, the wait signal WAIT and the data strobe signal DQS are both put into a high-impedance state in a clock cycle CY2.

In FIG. 2, the data strobe signal DQS is put into a high-impedance state until the wait state is finished. Furthermore, for the data strobe signal DQS, a time period tLZ is called as a low impendence time from a rising edge of the clock signal CLK in the clock cycle CY1. In general, the data strobe signal DQS is used to latch the data D0-D7, and a tracking circuit is used to track the data strobe signal DQS in a conventional controller. For example, when it is detected that the wait signal WAIT has been de-asserted (or asserted in another embodiment from different design specification), the conventional controller needs to mask the impendence period of the data strobe signal DQS, so as to gate the data strobe signal DQS. If the masked impendence period of the data strobe signal DQS is mistaken due to the variable time period tRL and the time period tLZ, it is hard to obtain the valid data D0-D7 according to the data strobe signal DQS. For example, if the wait signal WAIT or the data strobe signal DQS drifts in the clock cycle CY1, a transient of the wait signal WAIT may be later than the time period tLZ, i.e. the data strobe signal DQS is de-asserted earlier than the transient of the wait signal WAIT, thereby generating a time violation. Therefore, it is hard to mask the impendence period of the data strobe signal DQS for the conventional controller, thus causing invalid data latching.

Figure 3:
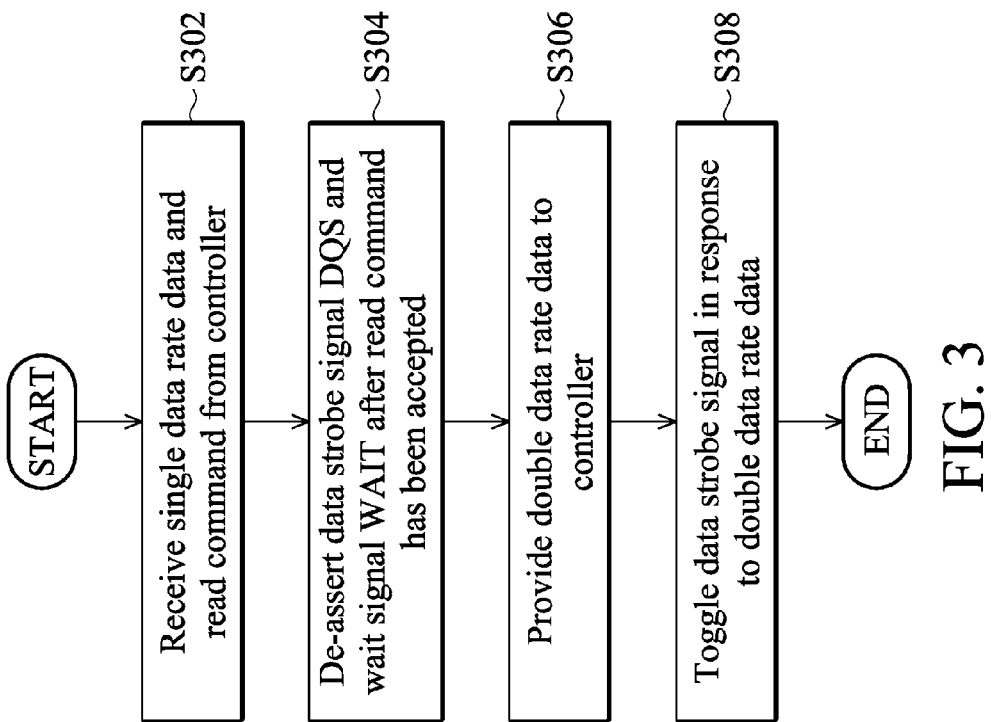
FIG. 3 shows an operating method for a low pin count DDR PSRAM (e.g. PSRAM of FIG. 1) according to an embodiment of the invention.
Figure 4:
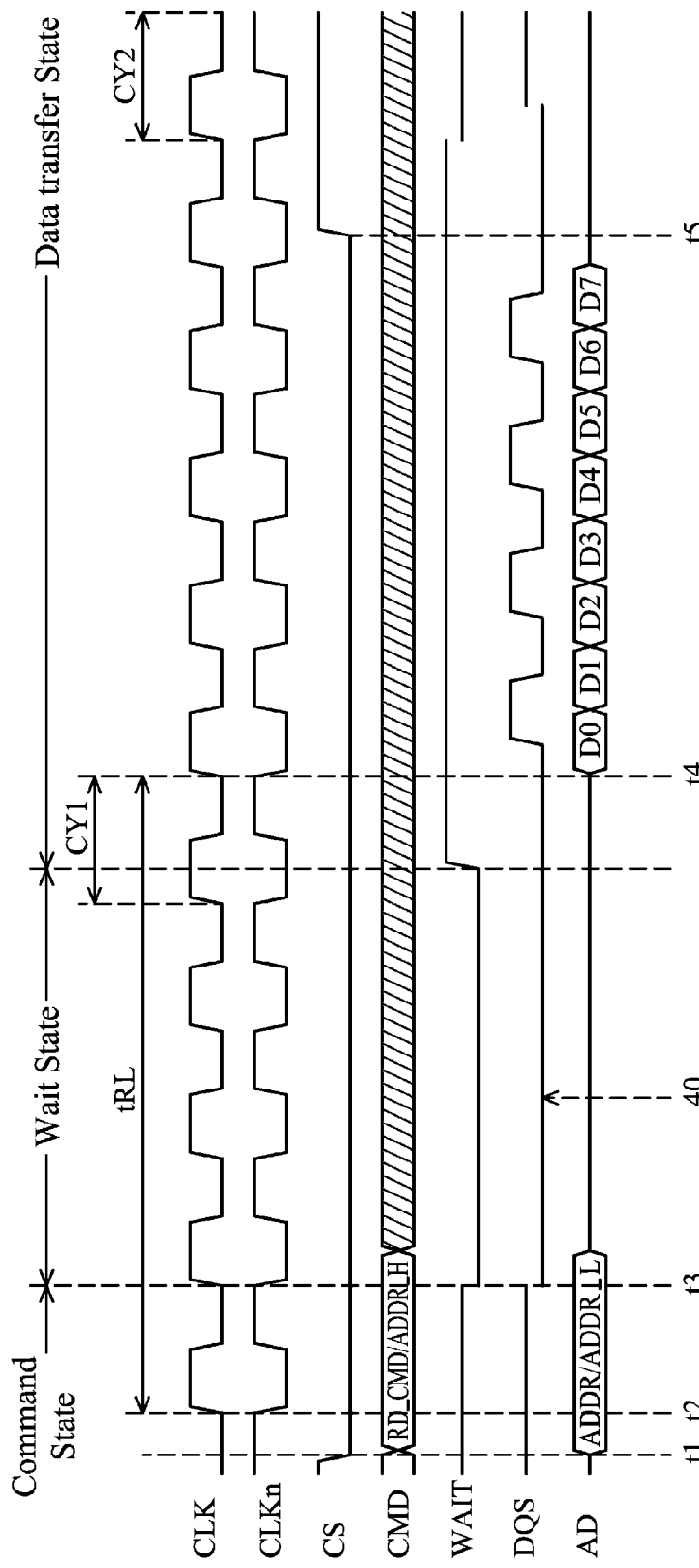
FIG. 4 shows a waveform illustrating the signals of FIG. 1 according to the operating method of FIG. 3.

FIG. 3 shows an operating method for a low pin count DDR PSRAM (e.g. PSRAM 20 of FIG. 1) according to an embodiment of the invention, and FIG. 4 shows a waveform illustrating the signals of FIG. 1 according to the operating method of FIG. 3. Referring to FIG. 3 and FIG. 4 together, in step S302, the DDR PSRAM receives a single data rate data from a controller via a common bus coupled between the DDR PSRAM and the controller, wherein the single data rate data comprises an address of the DDR PSRAM, as shown in a command state of FIG. 4. At the same time, the DDR PSRAM also receives a read command from the controller via a command signal. In step S304, after the read command from the controller has been accepted, the DDR PSRAM provides a data strobe signal DQS and a wait signal WAIT to the controller and de-asserts the data strobe signal DQS and the wait signal WAIT both, as shown in a wait state of FIG. 4. Next, the DDR PSRAM provides a double data rate data comprising data stored in the address of the DDR PSRAM to the controller via the common bus (step S306), and the DDR PSRAM toggles the data strobe signal in response to the transmitted double data (step S308). Compared to FIG. 2, the data strobe signal of FIG. 4 is de-asserted during the wait state, as shown in label 40, thus no time period tLZ of FIG. 2 exists. Therefore, the controller receives the double data rate data according to the data strobe signal DQS without masking the impendence period of the data strobe signal DQS. In other words, the controller can directly use both the rising and falling edges of the data strobe signal DQS to latch the double data rate data. Furthermore, the wait signal and the data strobe signal are assigned to a high-impedance until the read command from the controller is received by the DDR PSRAM, i.e. the wait signal and the data strobe signal are assigned to a high-impedance in the command state. In addition, after the data D0-D7 are received by the DDR PSRAM, the controller 10 asserts the chip select signal CS to finish the read operation, and then the wait signal WAIT and the data strobe signal DQS are both put into a high-impedance state.

Figure 5:
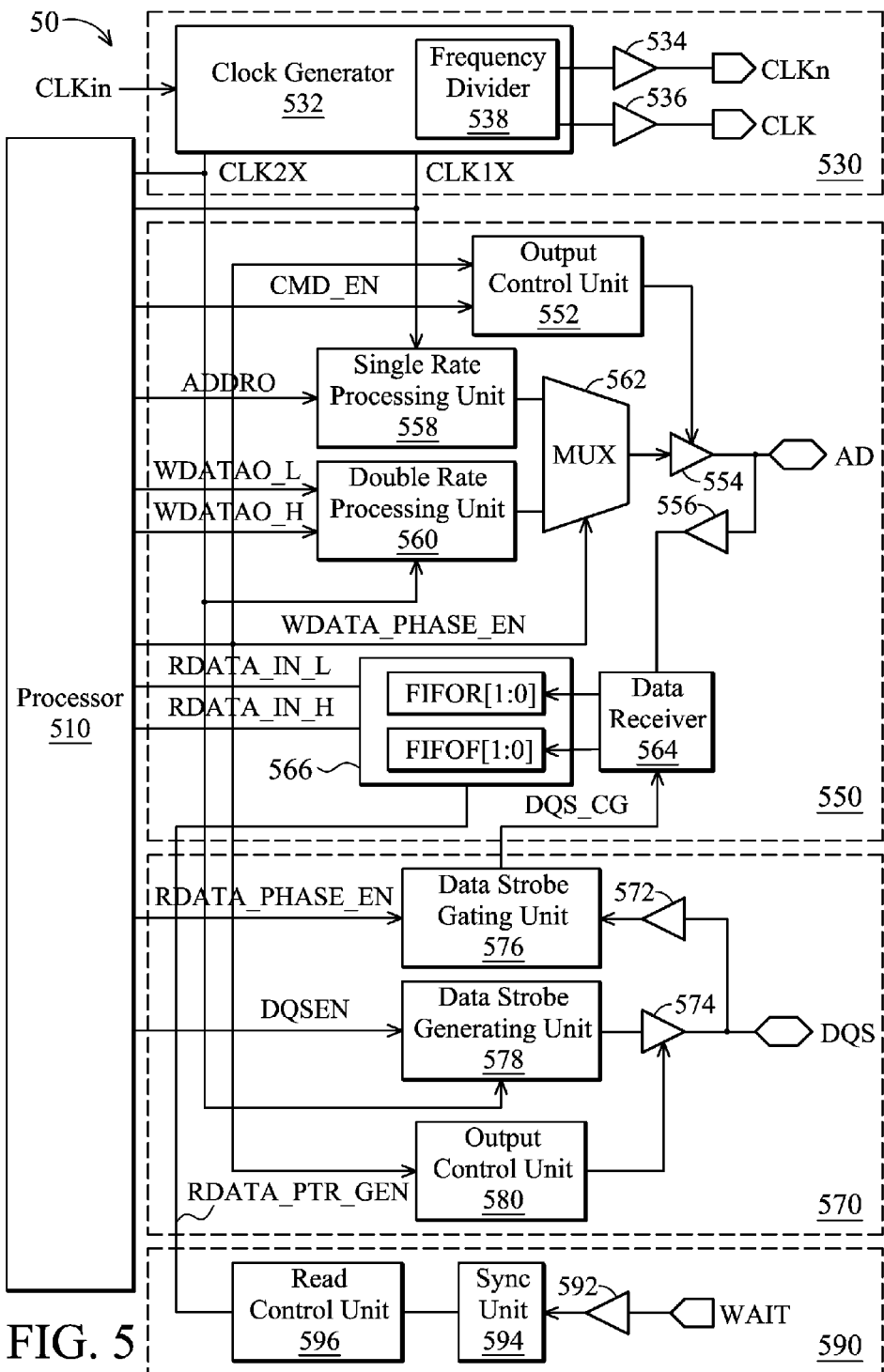
FIG. 5 shows a controller for a low pin count DDR PSRAM (e.g. PSRAM of FIG. 1) according to an embodiment of the invention.

FIG. 5 shows a controller 50 for a low pin count DDR PSRAM (e.g. PSRAM 20 of FIG. 1) according to an embodiment of the invention. The controller 50 comprises a processor 510, a clock module 530, an address/data module 550, a data strobe module 570 and a wait module 590. The processor 510 controls the clock module 530 to provide the differential clock signals CLK and CLKn to the DDR PSRAM. The clock module 530 comprises a clock generator 532 and two output buffers 534 and 536, wherein the clock generator 532 comprises a frequency divider 538. The clock generator 532 generates the clock signals CLK1X and CLK2X according to an input clock CLKin, wherein the clock signal CLK2X is two times the frequency of the clock signal CLK1X. In one embodiment, the input clock CLKin is provided by an oscillator. Furthermore, the frequency divider 538 divides the clock signal CLK2X to generate the CLK1X clock signal. The differential clock signals CLK and CLKn are generated from the CLK1X clock signal, and has the same frequency as that of the CLK1X clock signal. Moreover, the differential clock signals CLK and CLKn are provided to the DDR PSRAM via the output buffers 536 and 534, respectively. The processor 510 controls the address/data module 550 to provide address streams to the DDR PSRAM in a command phase, provide data streams to the DDR PSRAM in a write data phase, and receive data streams from the DDR PSRAM in a read data phase. The address/data module 550 comprises an output control unit 552, an output buffer 554, an input buffer 556, a single rate processing unit 558, a double rate processing unit 560, a selector 562, a data receiver 564 and a storage unit 566. The selector 562 is used to selectively provide any of the output of the single rate processing unit 558 and the double rate processing unit 560 to the output buffer 554 according to a control signal WDATA_PHASE_EN. In the embodiment, the selector 562 is a multiplexer (MUX). The processor 510 controls the data strobe module 570 to provide a data strobe signal to the DDR PSRAM in the write data phase and receive a data strobe signal from the DDR PSRAM in the read data phase. The data strobe module 570 comprises an input buffer 572, an output buffer 574, a data strobe gating unit 576, a data strobe generating unit 578 and an output control unit 580. The processor 510 controls the wait module 590 to receive a wait signal from the DDR PSRAM in the read data phase. The wait module 590 comprises an input buffer 592, a synchronization unit 594 and a read control unit 596. Details of descriptions illustrating the operations of the address/data module 550, the data strobe module 570 and the wait module 590 are described below.

Figure 6:
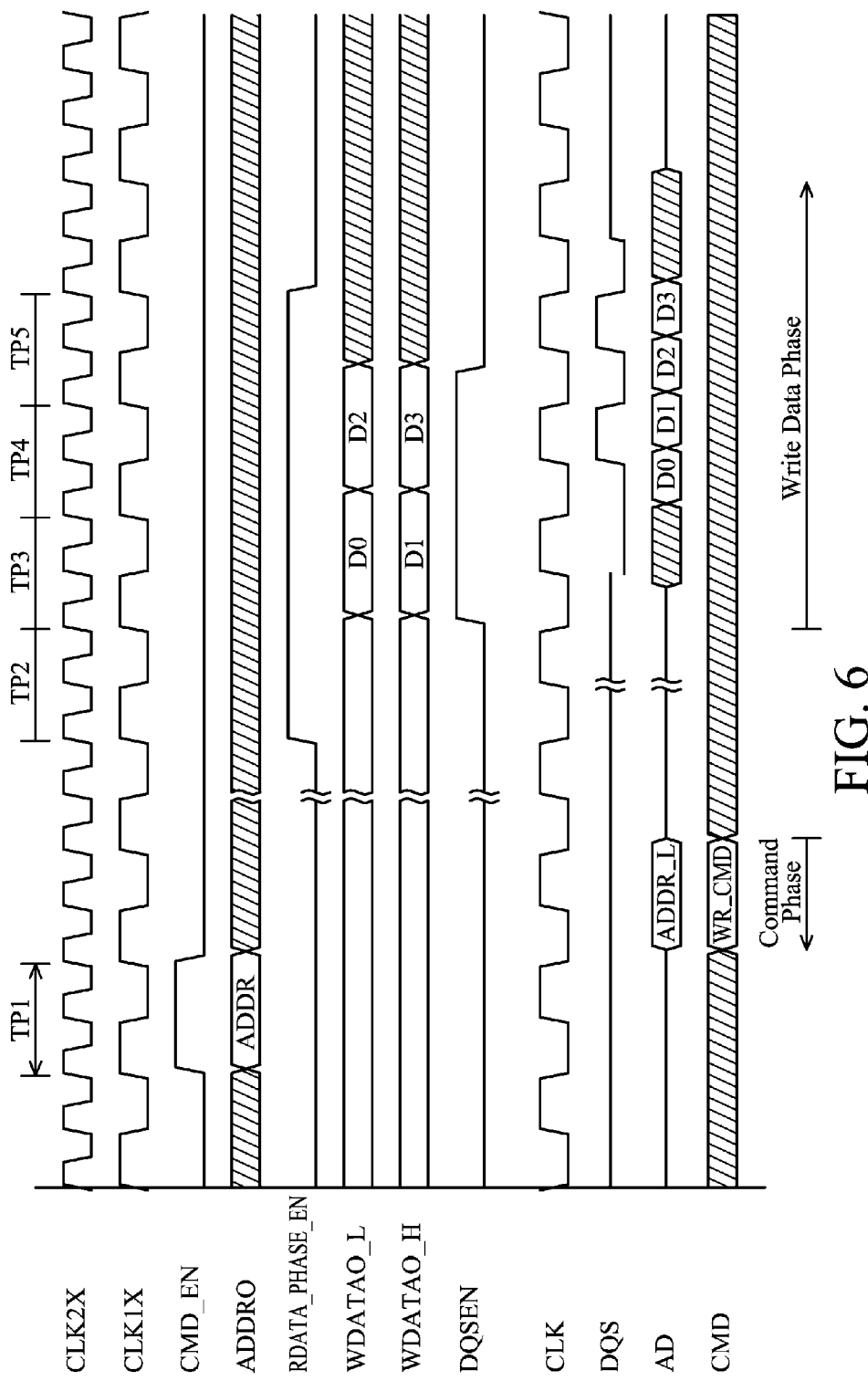
FIG. 6 shows a waveform illustrating the signals of the controller of FIG. 5 according to an embodiment of the invention, wherein the controller performs a synchronous write operation with 4 bursts for a low pin count DDR PSRAM (e.g. PSRAM of FIG. 1)

FIG. 6 shows a waveform illustrating the signals of the controller 50 of FIG. 5 according to an embodiment of the invention, wherein the controller 50 performs a synchronous write operation with 4 bursts for a low pin count DDR PSRAM (e.g. PSRAM 20 of FIG. 1). Referring to FIG. 5 and FIG. 6 together, during a time period TP1, the processor 510 provides an enable signal CMD_EN with a logic level HIGH to the output control unit 552, so as to control the output control unit 552 to enable the output buffer 554. At the same time, the processor 510 also provides a signal ADDRO with address information ADDR to the single rate processing unit 558. Next, the single rate processing unit 558 obtains a single data rate data with the address information ADDR according to the clock signal CLK1X and provides the single data rate data to the selector 562. Furthermore, the processor 510 provides a control signal WDATA_PHASE_EN with a logic level LOW to the selector 562, so as to control the selector 562 to output the single data rate data provided by the single rate processing unit 558, to the output buffer 554. Thus, an address/data signal AD with address information ADDR is provided to the DDR PSRAM in a command phase. In the meantime, a command signal CMD with a write command WR_CMD is sent to the DDR PSRAM via a command bus (e.g. 140 of FIG. 1). Next, from a time period TP2 to a time period TP5, the processor 510 provides the control signal WDATA_PHASE_EN with a logic level HIGH to the output control units 552 and 580, so as to control the output control units 552 and 580 to enable the output buffers 554 and 574. According to fixed write latency (such as N cycles), the processor 510 provides the control signal WDATA_PHASE_EN with a logic level HIGH upon the N clock cycle of the clock signal CLK1X after sending the write command, so as to enter the write data phase. Furthermore, the processor 510 provides the control signal WDATA_PHASE_EN to the selector 562, so as to provide an output of the double rate processing unit 560 to the output buffer 554. The processor 510 provides the signal WDATAO_L with a data D0 and the signal WDATAO_H with a data D1 to the double rate processing unit 560 during the time period TP3, and the processor 510 provides the signal WDATAO_L with a data D2 and the signal WDATAO_H with a data D3 to the double rate processing unit 560 during the time period TP4. The double rate processing unit 560 provides a double data rate data with the data D0, D1, D2 and D3 to the output buffer 554 via the selector 562 according to the clock signal CLK2X. Thus, an address/data signal AD with the data D0, D1, D2 and D3 is provided to the DDR PSRAM in the write data phase. In the embodiment, the double rate processing unit 560 alternately provides the data of the signals WDATAO_L and WDATAO_H as the double data rate data according to the clock signal CLK2X. Therefore, the address/data signal AD with data streams formed by the data D0-D3 can be transmitted to the DDR PSRAM in sequence. Moreover, during the time periods TP3 and TP4, the processor 510 provides an enable signal DQSEN with a logic level HIGH to the data strobe generating unit 578, so as to control the data strobe generating unit 578 to provide a data strobe signal DQS to the DDR PSRAM via the output buffer 574. Thus, the DDR PSRAM can receive the address/data signal AD according to both rising and falling edges of the data strobe signal DQS, and then the DDR PSRAM writes the data D0, D1, D2 and D3 into memory cells thereof according to the address information ADDR.

Figure 7:
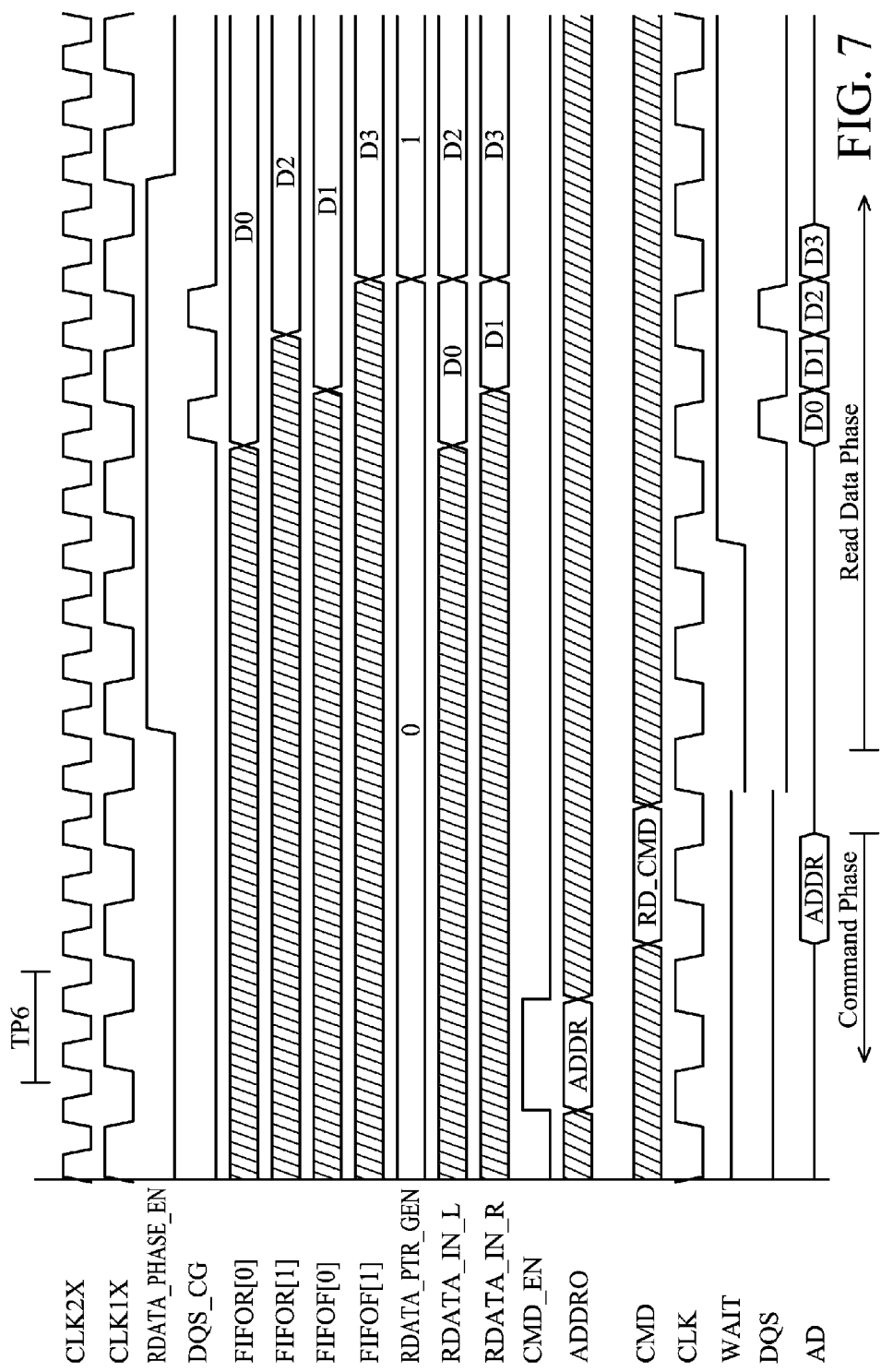
FIG. 7 shows a waveform illustrating the signals of the controller of FIG. 5 according to an embodiment of the invention, wherein the controller performs a synchronous read operation with 4 bursts for a low pin count DDR PSRAM (e.g. PSRAM of FIG. 1).

FIG. 7 shows a waveform illustrating the signals of the controller 50 of FIG. 5 according to an embodiment of the invention, wherein the controller 50 performs a synchronous read operation with 4 bursts for a low pin count DDR PSRAM (e.g. PSRAM 20 of FIG. 1). Referring to FIG. 5 and FIG. 7 together, during a time period TP6, the processor 510 provides an enable signal CMD_EN with a logic level HIGH to the output control unit 552, so as to control the output control unit 552 to enable the output buffer 554. At the same time, the processor 510 also provides a signal ADDRO with address information ADDR to the single rate processing unit 558. Next, the single rate processing unit 558 obtains a single data rate data with the address information ADDR according to the clock signal CLK1X and provides the single data rate data to the selector 562. Furthermore, the processor 510 provides a control signal WDATA_PHASE_EN with a logic level LOW to the selector 562, so as to control the selector 562 to output the single data rate data provided by the single rate processing unit 558, to the output buffer 554. Thus, an address/data signal AD with address information ADDR is provided to the DDR PSRAM in a command phase. In the meantime, a command signal CMD with a read command RD_CMD is sent to the DDR PSRAM via a command bus (e.g. 140 of FIG. 1). As described in the operating method of FIG. 3, after the read command RD_CMD of the command signal CMD from the controller is accepted, the DDR PSRAM provides a data strobe signal DQS and a wait signal WAIT to the controller and de-asserts the data strobe signal and the wait signal both in a wait state. In the wait module 590, the input buffer 592 transmits the wait signal WAIT from the DDR PSRAM to the synchronization unit 594 for synchronization, and the synchronization unit 594 provides a synchronized wait signal to the read control unit 596. Furthermore, the processor 510 provides the enable signal RDATA_PHASE_EN with a logic level HIGH upon 2 clock cycles after sending the read command RD_CMD, so as to enter a read data phase. Furthermore, the read control unit 596 provides a ready signal RDATA_PTR_GEN to the storage unit 566. In a read data phase, the data strobe gating unit 576 is enabled by the enable signal RDATA_PHASE_EN, to gate the data strobe signal DQS toggled by the DDR PSRAM, so as to obtain a gated signal DQS_CG and provide the gated signal DQS_CG to the read receiver 564. The read receiver 564 receives the address/data signal AD from the DDR PSRAM and stores the data of the address/data signal AD into first in first out units (FIFOs) of the storage unit 566 according to the gated signal DQS_CG, wherein the address/data signal AD comprises data streams formed by the data units D0, D1, D2 and D3 that are stored in the memory cells of the DDR PSRAM corresponding to the address information ADDR. For example, a first rising edge of the gated signal DQS_CG is used to latch the data D0 into the FIFO FIFOR[0], a first falling edge of the gated signal DQS_CG is used to latch the data D1 into the FIFO FIFOF[0], a second rising edge of the gated signal DQS_CG is used to latch the data D2 into the FIFO FIFOR[1], and a second falling edge of the gated signal DQS_CG is used to latch the data D3 into the FIFO FIFOF[1]. In other embodiments, the storage unit 566 may comprises the register or other storage cells to store the data of the address/data signal AD. Furthermore, the storage unit 566 provides the data units stored in the FIFOR[1:0] and FIFOF[1:0] to the processor 510 via the signals RDATA_IN_R and RDATA_IN_L according to the ready signal RDATA_PTR_GEN. Thus, the processor 510 obtains the data D0, D1, D2 and D3 corresponding to the address information ADDR. After the data D0, D1, D2 and D3 are stored by the processor 510, the processor 510 de-asserts the enable signal RDATA_PHASE_EN, to finish the read data phase.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A controller for a double data rate pseudo SRAM (DDR PSRAM), comprising:
   a single rate processing unit, obtaining a single data rate data according to a first data and a first clock;
   a double rate processing unit, obtaining a double data rate data according to a second data and a second clock that is two times the frequency of the first clock; and
   a selector, selectively providing any of the single data rate data and the double data rate data to the DDR PSRAM via a common bus according to a control signal.

2. The controller as claimed in claim 1, wherein the control signal controls the selector to provide the single data rate data to the DDR PSRAM in a command phase, and the control signal controls the selector to provide the double data rate data to the DDR PSRAM in a write data phase.

3. The controller as claimed in claim 1, wherein the first data comprises an address of the DDR PSRAM and the second data comprises data to be written into the address of the DDR PSRAM.

4. The controller as claimed in claim 1, further comprising:
   a frequency divider, dividing the second clock to obtain a third clock and providing the third clock to the DDR PSRAM, wherein the first clock and the third clock have the same frequency,
   wherein the DDR PSRAM receives the single data rate data according to the third clock.

5. The controller as claimed in claim 1, further comprising:
   a data strobe generating unit, providing a data strobe signal to the DDR PSRAM according to the second clock when the double data rate data is provided to the DDR PSRAM by the selector,
   wherein the DDR PSRAM receives the double data rate data according to the data strobe signal.

6. The controller as claimed in claim 5, wherein the second data comprises a plurality of data units that are divided into a first group and a second group, and the double rate processing unit alternately provides the data units of the first and second groups as the double data rate data according to the second clock, thereby enabling the DDR PSRAM to receive the data units of the first group in response to a rising edge of the data strobe signal and receive the data units of the second group in response to a falling edge of the data strobe signal.

7. An access method for writing data to a double data rate pseudo SRAM (DDR PSRAM), comprising:
   obtaining a single data rate data according to a first data and a first clock;
   obtaining a double data rate data according to a second data and a second clock that is two times the frequency of the first clock; and
   selectively providing any of the single data rate data and the double data rate data to the DDR PSRAM via a common bus.

8. The access method as claimed in claim 7, wherein the step of selectively providing the single data rate data or the double data rate data to the DDR PSRAM via the common bus further comprises:
   providing the single data rate data to the DDR PSRAM in a command phase; and
   providing the double data rate data to the DDR PSRAM in a write data phase.

9. The access method as claimed in claim 7, wherein the first data comprises an address of the DDR PSRAM and the second data comprises data to be written into the address of the DDR PSRAM.

10. The access method as claimed in claim 7, further comprising:
    dividing the second clock to obtain a third clock and providing the third clock to the DDR PSRAM, wherein the first clock and the third clock have the same frequency, wherein the DDR PSRAM receives the single data rate data according to the third clock.

11. The access method as claimed in claim 7, further comprising:
providing a data strobe signal to the DDR PSRAM according to the second clock when the double data rate data is provided to the DDR PSRAM,
wherein the DDR PSRAM receives the double data rate data according to the data strobe signal.

12. The access method as claimed in claim 11, wherein the second data comprises a plurality of data units that are divided into a first group and a second group, and the step of obtaining the double data rate data according to the second data and the second clock further comprises:
alternately providing the data units of the first and second groups as the double data rate data according to the second clock,
thereby enabling the DDR PSRAM to receive the data units of the first group in response to a rising edge of the data strobe signal and receive the data units of the second group in response to a falling edge of the data strobe signal.

13. A controller for a double data rate pseudo SRAM (DDR PSRAM), comprising:
a single rate processing unit, obtaining a single data rate data according to a first data;
an output buffer, providing the single data rate data to the DDR PSRAM via a common bus in a command phase;
a data strobe gating unit, gating a data strobe signal from the DDR PSRAM to obtain a gated data strobe signal in a read data phase; and
a data receiver, receiving a double data rate data from the DDR PSRAM via the common bus according to the gated data strobe signal, to obtain a second data.

14. The controller as claimed in claim 13, wherein the first data comprises an address of the DDR PSRAM and the second data comprises data stored in the address of the DDR PSRAM.

15. The controller as claimed in claim 13, further comprising:
a clock generator, providing a clock signal to the DDR PSRAM
thereby enabling the DDR PSRAM to receive the single data rate data according to the clock signal.

16. The controller as claimed in claim 13, wherein the second data comprises a plurality of data units that are divided into a first group and a second group, and the data receiver provides the data units of the first group to a first FIFO in response to a rising edge of the gated data strobe signal and provides the data units of the second group to a second FIFO in response to a falling edge of the gated data strobe signal.

17. The controller as claimed in claim 16, further comprising:
a processor, providing the first data;
a synchronization unit, synchronizing a wait signal from the DDR PSRAM, wherein the wait signal is de-asserted during a wait state; and
a read control unit, obtaining a ready signal according to the synchronized wait signal,
wherein the first FIFO and the second FIFO output the data units of the first group and the second group to the processor according to the ready signal.

18. An access method for reading data from a double data rate pseudo SRAM (DDR PSRAM), comprising:
obtaining a single data rate data according to a first data;
providing the single data rate data to the DDR PSRAM via a common bus in a command phase;
gating a data strobe signal from the DDR PSRAM to obtain a gated data strobe signal in a read data phase; and
receiving a double data rate data from the DDR PSRAM via the common bus according to the gated data strobe signal to obtain a second data.

19. The access method as claimed in claim 18, wherein the first data comprises an address of the DDR PSRAM and the second data comprises data stored in the address of the DDR PSRAM.

20. The access method as claimed in claim 18, further comprising:
providing a clock signal to the DDR PSRAM, thereby enabling the DDR PSRAM to receive the single data rate data according to the clock signal.

21. The access method as claimed in claim 18, wherein the second data comprises a plurality of data units that are divided into a first group and a second group, and the step of the receiving the double data rate data from the DDR PSRAM via the common bus according to the gated data strobe signal to obtain the second data further comprises:
providing the data units of the first group to a first FIFO in response to a rising edge of the gated data strobe signal; and
providing the data units of the second group to a second FIFO in response to a falling edge of the gated data strobe signal.

22. The access method as claimed in claim 18, further comprising:
synchronizing a wait signal from the DDR PSRAM, wherein the wait signal is de-asserted during a wait state;
obtaining a ready signal according to the synchronized wait signal; and
outputting the data units of the first group and the second group to a processor by the first and second FIFOs according to the ready signal.

23. An operating method performed by a double data rate pseudo SRAM (DDR PSRAM), comprising:
receiving a single data rate data from a controller via a common bus;
providing a data strobe signal to the controller, and de-asserting the data strobe signal after a read command from the controller is accepted;
transmitting a double data rate data to the controller via the common bus in response to the received single data rate data; and
toggling the data strobe signal in response to the transmitted double data rate data,
wherein the single data rate data comprises an address of the DDR PSRAM and the double data rate data comprises data stored in the address of the DDR PSRAM,
thereby enabling the controller to receive the double data rate data according to the data strobe signal.

24. The operating method as claimed in claim 23, further comprising:
providing a wait signal to the controller, and de-asserting the wait signal after the read command from the controller has been accepted; and
asserting the wait signal when the double data rate data corresponding to the read command is ready to be transmitted.

25. The operating method as claimed in claim 23, wherein the wait signal and the data strobe signal are assigned to a high-impedance until the read command from the controller is received.

26. The operating method as claimed in claim 23, further comprising:
receiving a command signal from the controller;

receiving a clock signal from the controller; and
obtaining the single data rate data and the read command of the command signal according to the clock signal.

* * * * *